United States Patent [19]

Tsunoda

[11] Patent Number: 5,032,880
[45] Date of Patent: Jul. 16, 1991

[54] SEMICONDUCTOR DEVICE HAVING AN INTERPOSING LAYER BETWEEN AN ELECTRODE AND A CONNECTION ELECTRODE

[75] Inventor: Tetsujiro Tsunoda, Fujisawa, Japan

[73] Assignee: Kabushiki Kaisha Toshiba, Kawasaki, Japan

[21] Appl. No.: 526,895

[22] Filed: May 22, 1990

[30] Foreign Application Priority Data

May 23, 1989 [JP] Japan ................... 1-129345

[51] Int. Cl.$^5$ ............ H01L 29/78; H01L 27/01; H01L 29/10; H01L 27/02
[52] U.S. Cl. ......................... 357/23.4; 357/23.1; 357/23.3; 357/43; 357/65
[58] Field of Search ............ 357/23.4, 23.3, 65, 357/23.1, 43

[56] References Cited

U.S. PATENT DOCUMENTS

| | | |
|---|---|---|
| 4,502,069 | 2/1985 | Schuh . |
| 4,630,084 | 12/1986 | Tihanyi ................ 357/43 |
| 4,878,105 | 10/1989 | Hirakawa et al. ........... 357/65 |
| 4,903,106 | 2/1990 | Fukunaga et al. .......... 357/23.4 |

FOREIGN PATENT DOCUMENTS

| | | | |
|---|---|---|---|
| 3824836 | 2/1989 | Fed. Rep. of Germany | 257/23.4 |
| 1-010672 | 10/1988 | Japan | 357/23.4 |
| 63-236366 | 10/1988 | Japan | 357/234 |
| 1-135071 | 5/1989 | Japan | 357/23.4 |

OTHER PUBLICATIONS

Patent Abstracts of Japan, vol. 10, No. 251 (E-432) (2307), Aug. 28, 1986, No. 61-80858, dated Apr. 24, 1986, Hitachi Ltd.
"Modern Power Devices", B. J. Baliga, pp. 369-370, 362.

Primary Examiner—Jerome Jackson, Jr.
Assistant Examiner—Daniel Kim
Attorney, Agent, or Firm—Finnegan, Henderson, Farabow, Garrett, and Dunner

[57] ABSTRACT

In a semiconductor device, such as an IGBT and DMOS FET, a parasitic transistor is created between a first region (drift region) and third electrode region (emitter region) of the same conductivity type on one hand and the surface portion of a second electrode region (base region) of conductivity type opposite to that of the first-mentioned conductivity type on the other hand. An interposing layer formed of, for example, an opposite conductivity type poly-Si layer is formed in a manner to partially cover the emitter region and base region. A metal electrode film is formed as a connection electrode on the whole surface of a resultant structure such that it is in ohmic contact with the base region. The interposing layer is formed of a conductive layer and interposed with the metal electrode film formed not in direct contact with the third electrode region. The interposing layer is electrically so connected as to have some extent of resistance.

15 Claims, 5 Drawing Sheets

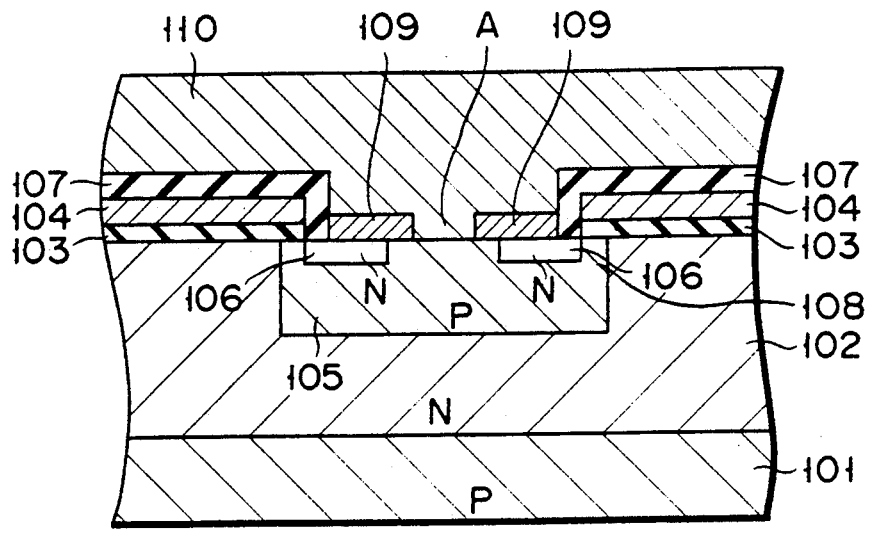
F I G. 1
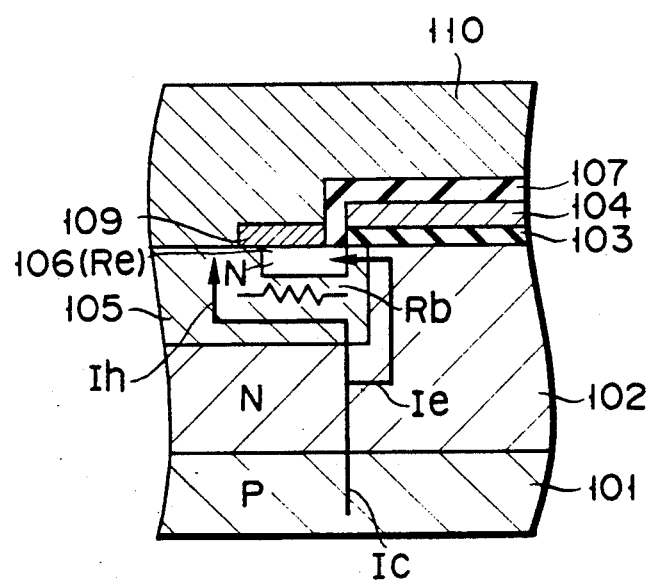
F I G. 2

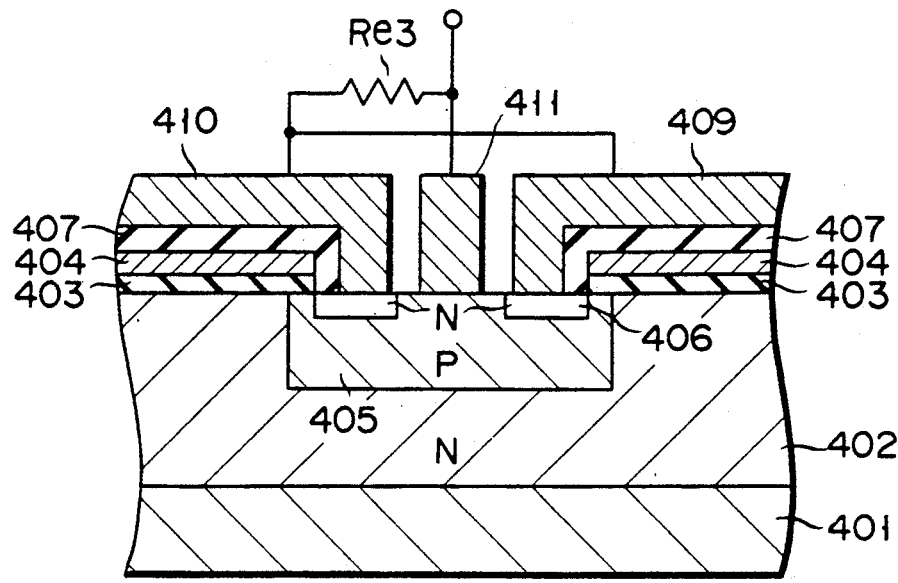
F I G. 7
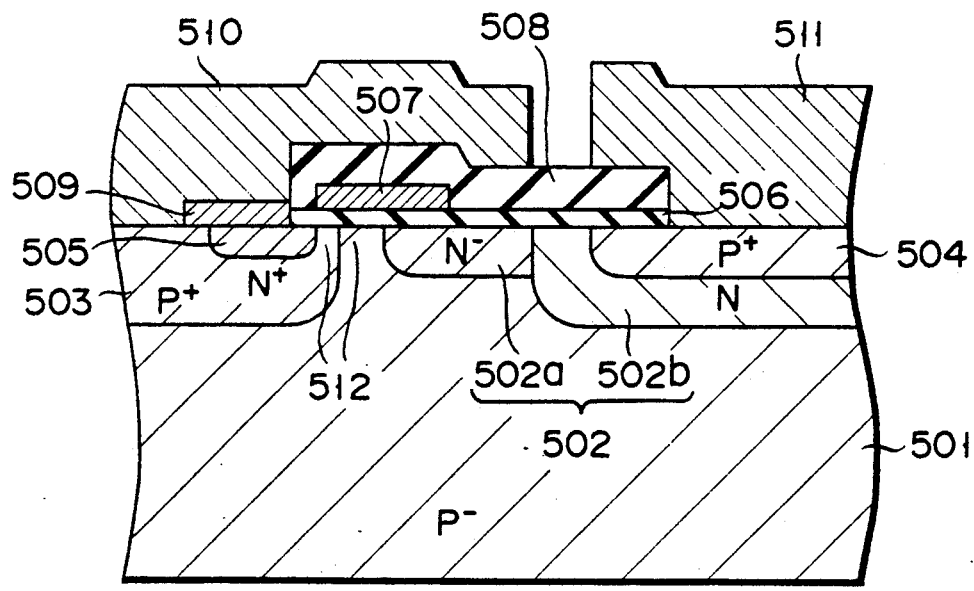
F I G. 8

SEMICONDUCTOR DEVICE HAVING AN INTERPOSING LAYER BETWEEN AN ELECTRODE AND A CONNECTION ELECTRODE

BACKGROUND OF THE INVENTION

1. Field of the Invention

The present invention relates generally to a semiconductor device and, more specifically, to a semiconductor device which can suppress the operation of a parasitic transistor as developed in an insulated gate bipolar transistor (hereinafter referred to as an IGBT) and in a dual-diffusion MOS field effect transistor (DMOS FET).

2. Description of the Related Art

Generally, an IGBT is of such a type as to have the low saturation voltage characteristic of a bipolar transistor and high-speed switching and high input impedance characteristics of a MOS FET.

The IGBT is used, as a switching device, in various associated circuits in view of less loss at the time of power conversion and less electric power for use in driving. The MOS FET has the same advantages as the IGBT and has been adopted in various circuits for an application principally required for high-speed switching.

That type of transistor as set out above is liable to produce an unwanted latch-up phenomenon resulting from the operation of the parasitic transistor as generally known in the art. The latch-up occurs upon the flow of a large current, such as the short-circuiting of a load, causing the device to be placed in an uncontrollable state. Unless the device is rendered nonconductive, abnormal current continues to flow across a power source and ground and, sometimes, the device is caused to be destroyed due to a temperature rise, etc. Further a DMOS FET, upon a rapid change in a voltage applied thereto, may be accompanied by the ON operation of a parasitic transistor and cause a breakage.

In the IGBT and MOS FET, however, a parasitic transistor is unavoidably involved due to their structural nature and the prevention of the ON operation of such a parasitic transistor is a great task to be solved.

Attempts have been made to prevent the turning on of a possible parasitic transistor by the adoption of a specific arrangement. Of these, the most common attempt is to lower the resistance $R_B$ of a base region so as to prevent a rise in a forward voltage on a base/emitter junction of a parasitic NPN transistor in the case of an N channel IGBT and MOS FET.

The lowering of the resistor $R_B$ is achieved, for example, (1) in a highly concentrated base region, (2) in a deep base region, (3) in emitter regions divided in the lateral width direction and (4) in an N type emitter region partly cut in the lateral width direction.

If these are adopted in the device, it is possible to control the conduction of the parasitic transistor, but the ON voltage of the device is raised and, at the same time, the mutual conductance is lowered due to an increase (a second case) or a decrease (a third case) in the channel region involved.

Thus the lowering of the resistance $R_B$ thus conventionally attempted results in an increase in power loss and a rise in gate drive voltage.

SUMMARY OF THE INVENTION

It is accordingly the object of the present invention to provide a semiconductor device which can suppress the conduction of a parasitic transistor involved and increase a current/voltage allowance leading to a breakage of the device or an allowance of a time variation in a voltage applied to the device.

According to the present invention, a first region is formed on a major surface of a semiconductor substrate of first conductivity type and has a conductivity type (second conductivity type) opposite to that of the semiconductor substrate. A gate electrode having an opening is formed on the first region and a second region of the first conductivity type is selectively formed in the first region exposed to the aforementioned opening. Third regions are selectively formed in a manner to be exposed in the second region. In this structure, a parasitic transistor is created by the first and third regions and the second region situated between the first and third regions. A conductive, interposing layer, such as a poly-Si layer of the second conductivity type, is formed in a manner to cover the third and second regions. A metal electrode film is formed, as a top layer, on the surface of the resultant structure so that it is ohmically connected to the second region. The interposing layer is situated on the third region such that the third region is not in direct contact with the metal electrode film, the metal electrode film being formed of a conductive material and being electrically connected to an associated layer while having a certain extent of resistance. The second and third regions serve as control electrodes such as the base electrode or an emitter electrode and the metal electrode film acts as a connection electrode.

At the ON time of the semiconductor device, a potential difference between the third region and the metal electrode film becomes greater than a potential difference between the second region and the metal electrode film, suppressing the ON operation of a parasitic transistor. The presence of the aforementioned interposing layer increases an amount of current leading to a latch-up or increases an amount of current (voltage) leading to a breakage of the device at the switching time.

According to the present invention, a semiconductor device is provided which can suppress the ON operation of a parasitic transistor and increase an allowance of a current (voltage) leading to a breakage of the device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a cross-sectional view showing a structure of an N channel vertical type IGBT as a semiconductor device according to a first embodiment of the present invention;

FIG. 2 shows a current path for explaining the operation of the IGBT of FIG. 1;

FIG. 7 is a cross-sectional view showing an N channel vertical type IGBT as a semiconductor device according to a fifth embodiment of the present invention;

FIG. 8 is a cross-sectional view showing an N channel lateral type IGBT as a semiconductor device according to a sixth embodiment of the present invention.

DETAILED DESCRIPTION OF THE PREFERRED EMBODIMENT

Figure 3:
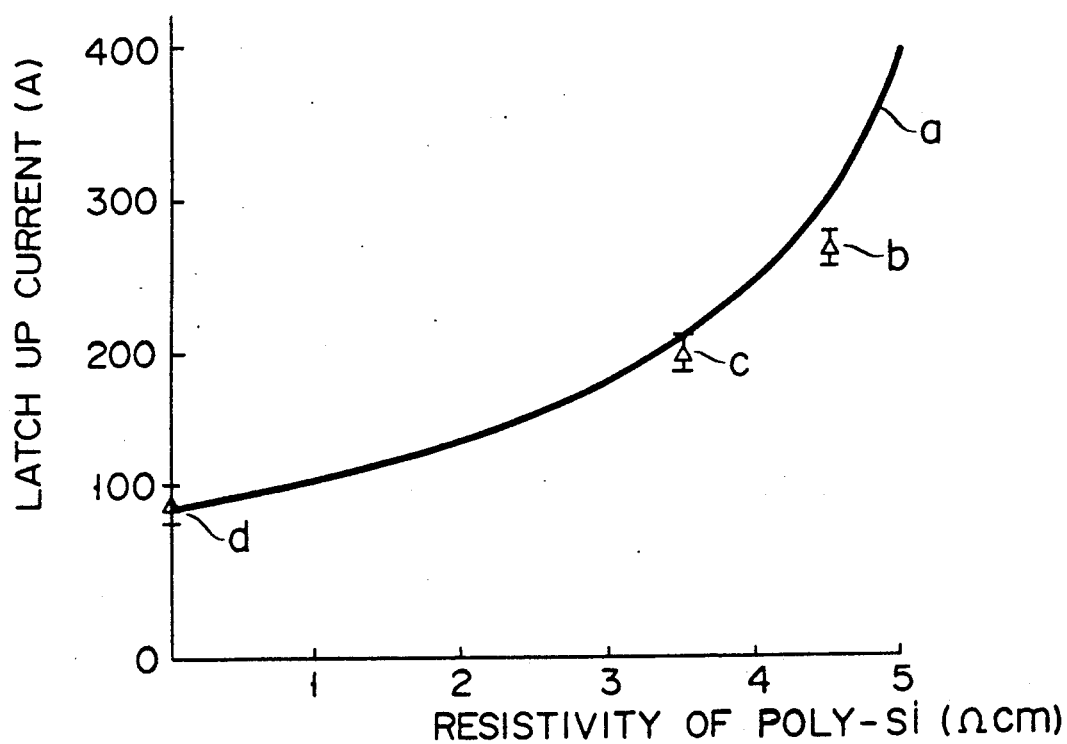
FIG. 3 is a graph showing a relation of a latch-up current to a resistivity of poly-Si (Ωcm)

The embodiments of the present invention will be explained below in more detail with reference to the accompanying drawings.

FIG. 1 is a cross-sectional view showing an N-channel vertical type IGBT according to a first embodiment of the present invention. In the N channel vertical IGBT, a first region (N drift region) 102 is formed by an epitaxial growth method on a P type collector area 101 of a semiconductor device. Here an N type semiconductor area, not shown, of high impurity concentration may be formed between the P type collector area 101 and the N drift region 102.

A gate insulating film 103 having an opening A is formed on the drift region 102. A gate electrode 104 of a conductive material is formed on the gate insulating film 103. With the gate electrode 104 used as a mask, an ion implantation step and thermal diffusion step are performed in the N drift region 102 to selectively form a second control electrode region 105 (P base region).

With the gate electrode 104 and resist used as a mask, third control electrode regions (N emitters) 106 are selectively formed in the P base region 105 to have their surfaces exposed. An insulating interlayer 107 for the gate electrode is formed in a manner to cover the gate electrode 104.

A channel formation region 108 is formed in the surface portion of the P base region 105 such that it is located between the N drift region and the N emitter regions 106.

An interposing conductive layer 109 of, for example, N type polysilicon, is formed on the N emitter region 106 to partially cover the P base region 105. A metal electrode film 110 is formed on the whole surface of the resultant structure. The metal electrode film 110 is formed in an ohmic contact with the P base region 105.

FIG. 2 is a view showing an electric current path in the element shown in FIG. 1. The operation of the first embodiment will be explained below with reference to FIG. 2. Here a parasitic transistor is an NPN transistor comprised of the N drift region 102, P base region 105 and N emitter region 106.

Generally, the parasitic transistor is turned ON when a base-to-emitter junction voltage Veb exceeds a built-in voltage, such as 0.7 V. The current $I_{latch}$ (hereinafter referred to a latch-up current) at which the aforementioned IGBT is placed in a latch-up state is substantially equal to the IGBT at that time.

Suppose that a Hall current Ih indicates a current flowing from the N drift region 102 to the P base region 105; Ie, an electric current flowing through the N emitter region 106; Rb, an internal resistance Rb of the P base region 105; and Re, an internal resistance Re of the N emitter region 106. Also suppose that, in an ohmic contact state, Vpm=0 denotes the potential difference between the P base region 105 and the metal electrode film 110, Vnm=0 denotes the potential difference between the P base region 105 and the metal electrode film 110, and [$\alpha_{PNP}$] denotes a current gain of a parasitic PNP transistor comprised of the P collector area 101, N drift region 102 and P base region 105.

Then the Hall current Ih is given below:

$$Ih = \alpha_{PNP} \times Ic \quad (1)$$

A maximum voltage Veb on the base-to-emitter junction of the parasitic transistor can be expressed below.

$$Veb = Rb \times Ih + Vpm - Vnm \quad (2),$$

provided that the conductive interposing layer is not provided.

Since, as set forth above, the parasitic transistor is turned ON when Veb > 0.7 V, the latch-up current $I_{Ll}$ is given below from Equations (1), (2), Vpm=0 and Vnm=c $$I_{Ll} = Ic = 0.7/(Rb \times \alpha_{PNP}) \quad (3)$$

Taking the presence of the interposing layer 109 into consideration, a voltage drop occurs due to a resistance Re of the interposing layer 109 when the IGBT is rendered conductive, generating a potential difference Vnm $$Vnm = Ie \times Re \quad (4)$$

between the metal electrode film 110 and the N emitter region 106. Thus the latch-up current $I_{latch}$ is given below from Equations (1), (2) and (4)

$$I_{latch} = 0.7/(Rb \times \alpha_{PNP}) + (Re \times Ie)/(Rb \times \alpha_{PNP}) \quad (5)$$

Now suppose that the latch-up current of a conventional IGBT rated at 25A is 100A. Then the latch-up current of the IGBT (present embodiment) having the interposing layer 109 5000 Å thick which is formed of N type poly-crystallin silicon of a 3.3 Ωcm resistivity becomes about 200A, a greater improvement over that (100A) of the conventional counterpart. Furthermore, the IGBT of the present embodiment which is rated at 25A can suppress an ON voltage rise to about 0.08 V without degrading the transconductance.

FIG. 3 shows a relation of a variation in latch-up current to a variation in resistivity of the interposing layer 109 in the first embodiment of the present invention. In the graph shown in FIG. 3, the abscissa denotes the resistivity of the interposing layer 109 5000 Å thick formed of N type crystal silicon and the ordinate denotes a latch-up current level. The solid curve a in FIG. 3 represents a calculated value (ideal value) of the latch-up current as obtained by substituting the resistive value Re of the interposing layer into Equation (5).

Several IGBTs were manufactured as samples having a 5000 Å-thick interposing layer of N type poly-crystallin silicon having a resistivity of 3.3 Ωcm and 4.5 Ωcm. The measured values of the IGBT's latch-up current are indicated by short solid lines b and c. The length of these short solid lines shows a width variation in the measured values as produced in the manufactured samples.

From this it will be understood that the latch-up current is increased due to an increase in the resistivity involved. The main reason for this is that the base-to-emitter voltage Veb of the parasitic transistor was decreased due to an increase in the potential difference Vnm between the N emitter 106 and the metal electrode film 110. Here the present invention is ensured by an agreement between the measured level and the calculated value of the latch-up current. For a short solid line d in FIG. 3, an electric current flowing in the N emitter is given as an electric current Ie below in view of Equation (5).

$$Ie = (1 - \alpha_{PNP})Ic \qquad (6),$$

provided that the interposing layer 109 is not formed (the aforementioned resistance Re=0) and that the latch-up current $I_{latch} = 100A$ and the current gain $\alpha_{PNP} = 0.45$.

Although the first embodiment employs a bulk resistance of the poly-Si of which the interposing layer 109 is formed, a metal-resistance thin film and single crystal silicon diffusion film can be employed in place of the poly-crystallin silicon.

If, for example, the aforementioned metal-resistance thin film is formed of a conductive material which is a metal element of a greater work function, such as Pt and Mo, a different material from the material of which the metal electrode 110 is formed, a non-ohmic junction is created between the interposing layer 109 and the N emitter region 106 and a potential difference Vnm is produced at that junction in a turned-ON state.

Furthermore, even if no particular conductive, interposing layer is formed between the N emitter region 106 and the metal electrode film 110, a non-ohmic junction performing the same function as that of the interposing layer is formed by making the surface portion of the N emitter region 106 at a low concentration level. As a result, upon the conduction of the IGBT, a potential difference Vnm is developed between the N emitter region 106 and the metal electrode 110.

Figure 4:
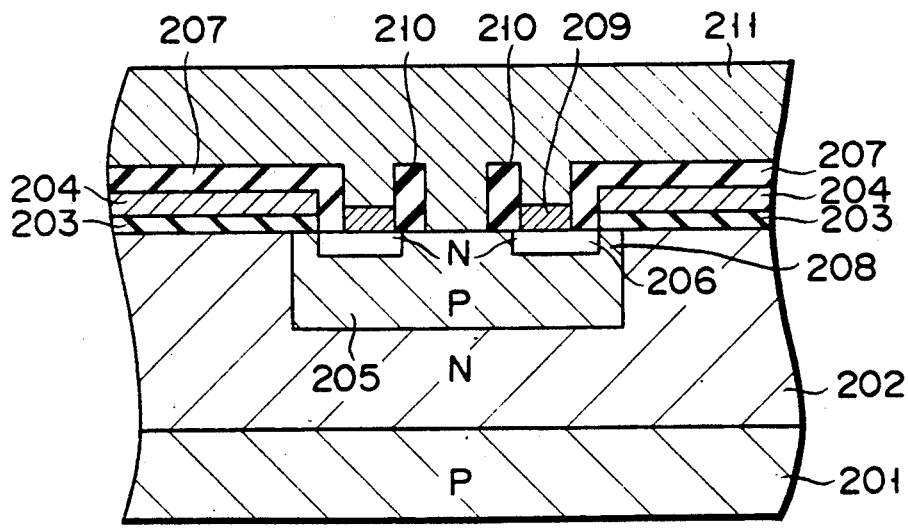
FIG. 4 is a cross-sectional view showing a structure of an N channel vertical type IGBT as a semiconductor device according to a second embodiment of the present invention.

FIG. 4 is a cross-sectional view showing an N channel vertical type IGBT according to a second embodiment of the present invention. The second embodiment constitutes a variant of the first embodiment of the present invention.

A first region (N drift region) 202 is epitaxially grown on a P type collector area 201. Here, an N type semiconductor area, not shown, of high concentration may be formed between the P type collector area 201 and the N drift region 202.

A gate insulating film 203 having an opening is formed on the drift region 202 and then a gate electrode 204 of a conductive material is formed on the gate insulating film 203 to provide a gate. An ion is implanted in the N drift region 202 with the gate electrode 204 used as a mask and a thermal diffusion treating step is performed to form a second region (P base region) 205 at a location defined by the aforementioned opening.

With the gate electrode 204 used as a mask, third regions (N emitter regions) are formed in the P base region 205. An insulating interlayer 207 for the gate electrode is formed over the N drift region 202 in a manner to cover the gate electrode 204.

As a result, a channel formation region 208 is formed in the surface portion of the base region such that it is located between the N drift region 202 and the N emitter regions 206.

An interposing layer (N type poly-Si) 209 which is smaller than the N emitter 206 is formed on the N emitter region 209. An insulating wall 210 is formed in a manner to partially cover the N emitter region 206 and exposed surface of the P base region 205. A metal electrode film 211 is formed over the whole surface of the resultant structure. The insulating wall 210 is so formed that the metal electrode film 211 is electrically connected by the interposing layer 209 to the N emitter region 206. The metal electrode film 211 is formed in ohmic contact with the P base region 205.

The IGBT of the second embodiment improves a latch-up current nearly two times as great as that of the conventional counterpart and, therefore, suppresses an ON voltage and does not degrade the transconductance. It is thus possible to obtain the same advantage as set out in connection with the first embodiment.

Figure 5:
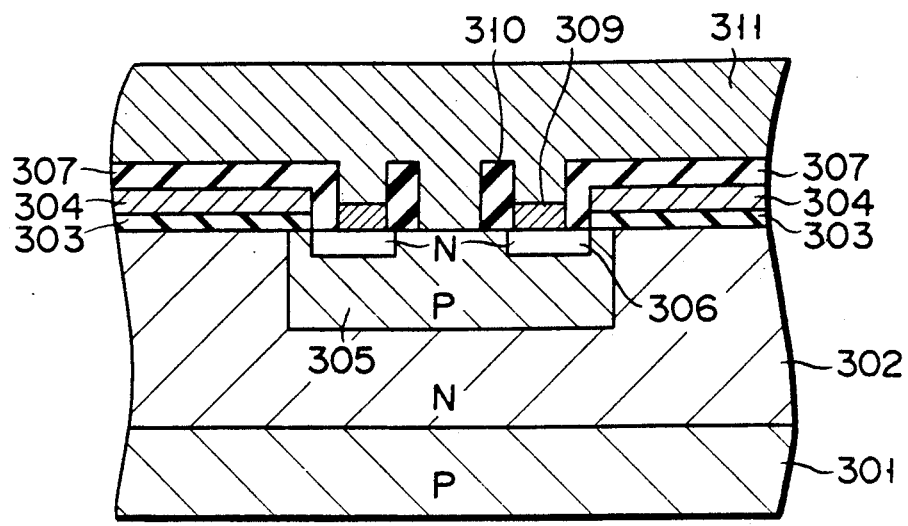
FIG. 5 is a cross-sectional view showing an N channel vertical type IGBT as a semiconductor device according to a third embodiment of the present invention.

A third embodiment of the present invention will be explained below with reference to FIG. 5.

In the third embodiment, a P type poly-Si layer highly doped with an impurity is employed as the aforementioned interposing layer 209 in the second embodiment. Thus the third embodiment is similar to the second embodiment in their cross-sectional structure. It is possible to form a multi-level structure from a P type collector area 301 to an insulating interlayer 307 as in the case of the second embodiment.

An interposing layer 309, which is smaller than the N emitter region 306, is formed on the N emitter region 306 and is formed of a P type poly-Si layer doped with an impurity to an impurity concentration level of $1 \times 10^{19}$ (atoms/cm$^3$). It is preferable to employ phosphorus as an impurity element for the N emitter region 306.

An insulating wall 310 is formed in a manner to partially cover the emitter region 306 and exposed surface of the P base region 305. The interposing layer 309 is connected to the N emitter region 306 only, this being achieved by the insulating wall 310. A metal electrode film 311 is formed on the whole surface of the resultant structure such that it is ohmically connected to the P base region 305.

In the arrangement thus formed, a PN junction (interposing layer 309) of a high impurity concentration is formed between the metal electrode film 311 and the N emitter region 306 and, at the ON time of the IGBT, a reverse voltage is applied to the PN junction layer, causing current to flow due to Zener breakdown. At this time, a Zener breakdown voltage which is produced between the metal electrode film 311 and the N emitter region 306 corresponds to a potential difference Vnm of Equation (2) as set forth above whereby it is possible to largely improve a latch-up current of the IGBT. Upon the measurement of a 25A-rated IGBT of an impurity concentration $1 \times 10^{19}$ (atoms/cm$^3$) manufactured such that it includes an interposing layer 309 of 5000 Å in thickness, the latch-up current was able to be improved, by a factor of about 1.5 or above, over that of the conventional IGBT.

The interposing layer 309 of poly-Si having a high impurity concentration may be formed of a very thin insulating film. The use of such a thin insulating film enables electric current to flow due to the tunnel effect to obtain a desired potential different Vnm.

Figure 6:
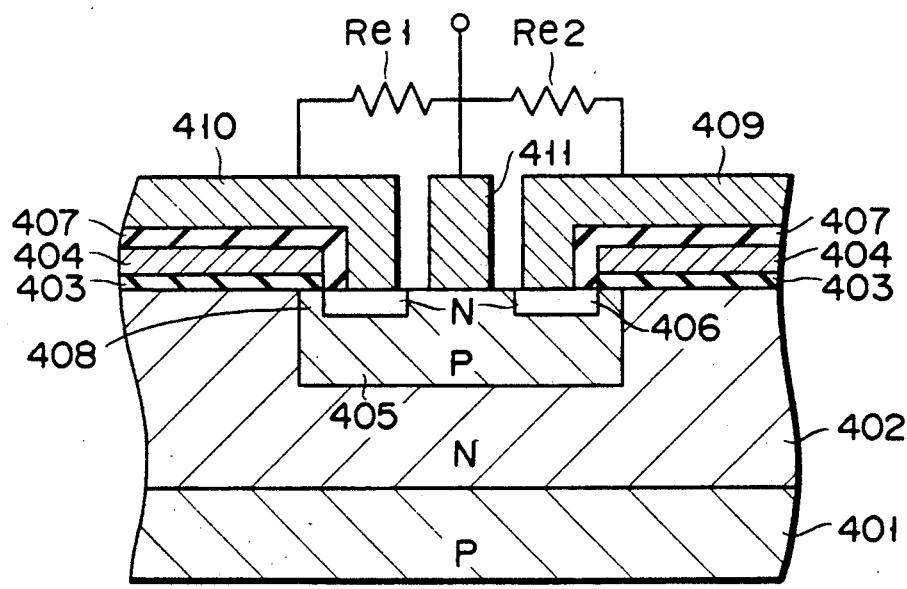
FIG. 6 shows an N channel vertical type IGBT as a semiconductor device according to a fourth embodiment of the present invention.

FIG. 6 is a cross-sectional view showing an N channel vertical type IGBT according to a fourth embodiment of the present invention.

A first region (N drift region) 402 is epitaxially grown on a P type collector area 401. Here an N type semiconductor, not shown, of a high concentration may be formed between the P type collector area 401 and the N drift region 402.

A gate insulating film 403 having an opening is formed on the drift region 402 and a gate electrode 404 is formed on the gate insulating film 403 to provide a gate. With the gate electrode used as a mask, an ion-implantation step is performed in the N drift region 402 and a thermal diffusion treating step is performed to provide a second region (P base region) 405 substantially in a range corresponding to the aforementioned opening.

Third regions (N emitter regions) 406 are formed, by an ion implantation step for instance, in the P base region with the gate electrode 404 as a mask. An insulating interlayer 407 for a gate electrode is formed in a manner to cover the gate electrode 404.

A channel formation region 408 is formed in the P base region such that it is located between the N drift region 402 and the N emitter region 406.

Emitter metal electrodes 409 and 410 are formed on the N emitter regions 406 and a base metal electrode film 411 is formed on the P base region 405 to electrically isolate the emitter metal electrode 409 from the emitter metal electrode 410. An electric current may be derived from the base metal electrode film 411 by forming a conductive film between the emitter metal electrodes 409, 410 and the base metal electrode film 411 so that a voltage drop occurs at the ON time of the IGBT.

The aforementioned conductive layer may be composed of, for example, a metal resistor (Re1, Re2) in which case the metal resistor Re1 is connected at one end to the emitter metal electrode film 409 and the metal resistor Re2 is connected at one end to the emitter metal electrode film 410 with the other end of each of the metal resistors Re1 and Re2 connected in common and connected to the base metal electrode film 411 and derived from that common junction. The metal resistors Re1, Re2 serve as negative feedback resistors, suppressing a rise in the base-to-emitter voltage of a parasitic transistor and hence improving a latch-up current.

FIG. 7 is a cross-sectional view showing an N channel vertical type IGBT according to a fifth embodiment of the present invention. The fifth embodiment uses a metal resistor Re3 in place of the metal resistors Re1 and Re2 in the fourth embodiment of the present invention. Here, the same reference numerals are employed to designate parts or elements corresponding to those shown in FIG. 5 and any further explanation is, therefore, omitted for brevity's sake.

In the embodiment shown in FIG. 7, a metal resistor Re3 is connected at one end to emitter metal electrode films 409, 410 and at the other end to a base metal electrode film 411 and derived, as an electrode, from the base metal electrode film. This embodiment ensures the same advantage as that of the third embodiment.

In the fourth and fifth embodiments as set forth above, a PN junction diode which produces a potential difference across a desired Zener breakdown voltage may be mounted as a discrete component part to, or integral with, the present device.

Although, in the first to the fifth embodiments, the N channel vertical type IGBTs have been explained in connection with the present invention, the present invention can also be applied to a lateral type IGBT.

FIG. 8 is a cross-sectional view showing a P channel lateral IGBT according to a sixth embodiment of the present invention.

A first region (N drift region) 502 is formed in one major surface portion of a P− type silicon substrate 501 and comprises of a low concentration N− drift region 502a and high concentration N drift region 502b.

A second region (P+ base region) 503 is formed in the major surface portion of the P− type silicon substrate 501 and a P+ collected region 504 is formed such that it is situated on the high concentration N drift region 502b.

A third region (N+ emitter region) 505 is formed in the major surface of the substrate 501 such that it is situated on a P+ base region 503. A gate insulating film 506 is formed in a manner to cover the N+ emitter region 505, P+ base region 503, substrate 501, N drift region 502 and P+ collector region 504. A gate electrode 507 of a conductive film is formed on the gate insulating film 506. An insulating interlayer 508 for a gate electrode is formed on the gate insulating film 505 cover the gate electrode 507. An interposing layer 509 is formed on the major surface of the N+ emitter region 505 and surface portion of the P+ base region 503.

A metal electrode 510 is formed on the interposing layer and electrically connected to the N+ emitter region 505 through the interposing layer 509. A metal electrode film 511 is formed over the P+ collector region 504.

A channel formation region 512 is formed in the surface portion of the base region 503 and the P− type silicon substrate 501 defined between the N− drift region 502a and the N+ emitter region 505.

Since the channel formation region 523 has a greater impurity concentration difference between the P+ base region 503 and the P− type silicon substrate 501, the characteristics such as threshold voltage are substantially determined by the impurity concentration in the surface portion of the P+ base region 503.

The channel formation region 512 is ohmically connected to the gate electrode 507 and P+ base region 503.

The operation and effect of the interposing layer of the lateral IGBT so arranged are the same as those of the interposing layer of the vertical IGBT.

Figure 9:
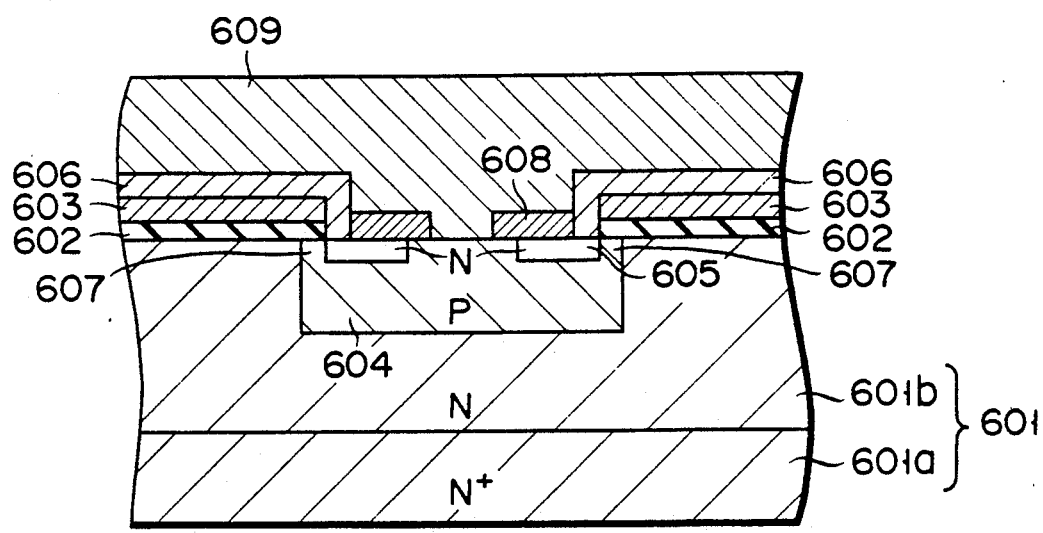
FIG. 9 is a cross-sectional view showing a structure of a vertical type DMOS FET as a semiconductor device according to a seventh embodiment of the present invention.

FIG. 9 is a cross-sectional view showing a vertical DMOS FET according to a seventh embodiment of the present invention. That is, a first region (N drift region) 601 is so formed as to provide an N+ drain region 601a and N drain region 601b.

A gate insulating film 602 having an opening is formed on the surface of the drift region 601. A gate electrode 603 of a conductive layer is formed on the gate insulating film 602 to provide a gate. With the gate electrode 603 used as a mask, an ion implanting step is performed in the N drain region 601b and a thermal diffusion step is performed to provide a second region (P base region) 604 relative to the aformentioned opening of the gate insulating film 602.

With the gate electrode 603 and resist, not shown, used as a mask, a third region (N source region) 605 is formed by, for example, an ion implantation step and an insulating interlayer 606 for the gate electrode is formed in a manner to cover the gate electrode 603.

A channel formation region 607 is formed in the surface portion of the P base region 604 at a location between the N drain region 601b and the N source region 605.

An interposing layer (poly-Si layer) 608 is formed on the N source region 605 in a manner to cover a portion of the P base region 604. A metal electrode film 609 is formed on the whole surface of the resultant structure such that it is ohmically connected to the P base region 604.

In the DMOS FET so constructed, a parasitic transistor is formed by the N source region 605, P base region 604 and N drain region 601. The interposing layer 608 acts as a negative feedback resistor of the parasitic transistor.

A rise in the base-to-emitter voltage of the parasitic transistor occurs by a transient voltage developed at the switching operation time of the DMOS FET. It is thus possible to prevent a breakage of the DMOS FET.

Even if the structure of the seventh embodiment is applied to the lateral DMOS FET, the eighth embodiment can obtain the same advantage as that of the seventh embodiment of the present invention.

Although the first to eighth embodiments have been explained in connection with the N channel IGBT and DMOS FET, the present invention can equally be applied to a P channel IGBT and DMOS FET. It is to be noted that the interposing layer is sometimes restricted to either one of the polarities in the case where the interposing layer present between the metal electrode film and the N emitter (source) region is placed in a non-ohmic connection state.

Additional advantages and modification will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device comprising:
   a first electrode region formed on one major surface of a substrate of first conductivity type and having a second conductivity type opposite to the first conductivity type;
   a second electrode region of the first conductivity type formed in the first electrode region by impurity diffusion, the second electrode region partially exposed through a surface of the first electrode region;
   a third electrode region of the second conductivity type formed in the second electrode region by impurity diffusion, the third electrode region partially exposed through a surface of the second electrode region;
   a gate insulating film formed on the first electrode region, the gate insulating film having an opening for exposing the second and third electrode regions;
   a gate electrode formed on the gate insulating film partially over the first electrode region;
   an insulating interlayer formed in a manner to cover the gate electrode;
   a metal electrode film formed as a connection electrode over the gate electrode with the insulating interlayer exclusively interposed between the gate electrode and the metal electrode film and the metal electrode film extending over the second and third electrode regions the metal electrode film ohmically connected to the second electrode region; and
   an interposing layer comprising conductive layers for electrical connection formed exclusively on the third electrode region and interposing between the metal electrode film and the third electrode region, and interposing layer being so formed that the metal electrode film is not electrically connected directly to the third electrode region.

2. The semiconductor device according to claim 1, wherein the interposing layer is formed of poly-Si.

3. The semiconductor device according to claim 1, wherein the interposing layer is formed of a metal thin film having a resistance.

4. The semiconductor device according to claim 1, wherein the interposing layer is formed of single crystalline silicon.

5. The semiconductor device according to claim 1, wherein an insulating wall is so formed as to partially cover the second and third electrode regions and the interposing layer is formed over the third electrode region at a location defined between the insulating wall and the insulating interlayer.

6. The semiconductor device according to claim 5, wherein the interposing layer is formed of P type poly-Si having a high impurity concentrtion.

7. The semiconductor device according to claim 5, wherein the interposing layer comprises very thin insulation.

8. A semiconductor device comprising:
   a first electrode region formed on one major surface of a semiconductor substrate of first conductivity type and having a second conductivity type opposite to the first conductivity type;
   a second electrode region of the first conductivity type formed in the first electrode region by impurity diffusion, the second electrode region partially exposed through a surface of the first electrode region;
   a third electrode region of the second conductivity type formed in the second electrode region by impurity diffusion, the third electrode region partially exposed through a surface of the second electrode region;
   a gate insulating film formed on the first electrode region, the gate insulating film having an opening for exposing the second and third electrode regions;
   a gate electrode formed on the gate insulating film partially over the first electrode region;
   an insulating interlayer formed over the gate electrode to cover the gate electrode;
   an emitter metal electrode film formed on the third electrode region, the emitter metal electrode film electrically connected to the third electrode region only;
   a base metal electrode film formed on the second electrode region to be electrically connected to the second electrode region only; and a resistor connected between the emitter metal electrode and the base metal electrode film, the resistor acting as a negative feedback resistor.

9. The semiconductor device according to claim 8, wherein a plurality of resistors are connected between the emitter metal electrode films and the base metal electrode film.

10. The semiconductor device according to claim 8, wherein the resistors act as a juction diode element.

11. A lateral IGBT comprising:

a semiconductor substrate of a first conductivity type having a major surface;

a first electrode region composed of two electrode regions of a second conductivity type formed in the semiconductor substrate in a manner to be exposed on the major surface of the semiconductor substrate, one of the two electrode regions having a different impurity concentration than the other electrode region;

a second electrode region of the first conductivity type formed in a manner to be exposed on the major surface of the semiconductor substrate, the second electrode region being formed ina spaced-apart relation to the first electrode region to define a channel forming region in the semiconductor substrate between the first and second electrode regions;

a collector region of the first conductivity type formed in the first electrode region which has higher impurity concentration;

a third electrode region of the second conductivity type formed in the second electrode region;

a gate insulating film formed over the first, second and third electrode regions to at least partially cover the first, second and third electrode regions;

a gate electrode formed of a conductive layer formed on the gate insulating film over the channel forming region;

insulating interlayers formed on the gate electrode to cover the gate electrode;

a first metal electrode film formed over the second and third electrode regions in ohmic contact with the second electrode region;

seocnd metal electrode film formed on the collector region in a manner to be in ohmic contact with the collector region, the second metal electrode film electrically isolated from the first metal electrode film; and an interposing layer formed of a conductive layer for electrical connection, the interposing layer being interposed between the first metal electrode film and the third electrode region and the interposing layer located such that the first metal electrode film is not in direct contact with the third electrode region.

12. The DMOS according to claim 1, wherein it is replaced by a lateral DMOS FET.

13. The semiconductor device according to claim 1 which is a vertical DMOS FET.

14. The semiconductor device according to claim 3 wherein the connection between the interposing layer and the third electrode region is non-ohmic.

15. A semiconductor device comprising:

a first electrode region formed on one major surface of a substrate of first conductivity type and having a second conductivity type opposite to the first conductivity type;

a second electrode region of the first conductivity type formed in the first electrode region by impurity diffusion, the second electrode region partially exposed through a surface of the first electrode region;

a third electrode region of the second conductivity type formed in the second electrode region by impurity diffusion, the third electrode region partially exposed through a surface of the second electrode region;

a gate insulating film formed on the first electrode region, the gate insulating film having an opening for exposing the second the third electrode regions;

a gate electrode formed on the gate insulating film partially over the first electrode region;

an insulating interlayer formed in a a manner to cover the gate electrode;

a metal electrode film formed as a connection electrode over the gate electrode with the insulating interlayer exclusively interposed between the gate electrode and the metal electrode film and the metal electrode film extending over the second and third electrodes, the metal electrode film ohmically connected to the second electrode region; wherein a non-ohmic junction is formed by lowering an impurity concentration in a surface portion of the third electrode region so that a potential difference is developed across the third electrode layer and the metal electrode film upon the conduction of the device.

* * * * *